United States Patent

[11] 3,626,327

[72] Inventors Thomas Hugo Luchsinger
Belmont;
Walter Ransom Day, Jr., Menlo Park, both of Calif.
[21] Appl. No. 48,296
[22] Filed June 22, 1970
[45] Patented Dec. 7, 1971
[73] Assignee Litton Systems, Inc.
San Carlos, Calif.

[54] TUNABLE HIGH-POWER LOW-NOISE STABILIZED DIODE OSCILLATOR
9 Claims, 6 Drawing Figs.

[52] U.S. Cl. 331/107 R, 331/96, 331/107 G, 331/177 V, 333/73 W, 333/83, 334/15
[51] Int. Cl. H03b 7/14
[50] Field of Search 331/107, 96, 177; 334/15; 333/73, 83

[56] References Cited

UNITED STATES PATENTS 3,510,800 5/1970 Kaneko et al. 331/107
3,534,293 10/1970 Harkless 331/107

*Primary Examiner*—John Kominski
*Attorneys*—Alan C. Rose, Alfred B. Levine and Ronald M. Goldman

ABSTRACT: The invention disclosed is a tunable high-power low-noise stabilized frequency semiconductor diode oscillator unit which comprises a semiconductor diode, suitably a Gunn or Avalanche diode, located within a low-Q-resonant cavity for generating the carrier frequency, $f_0$; and another cavity, tuned to $f_0$ and having a very high-Q-relative to the first cavity, is tightly coupled to the low-Q-cavity. A microwave output passage in the low-Q-cavity is provided for connection of the oscillator output directly to a load; wherein the oscillator provides output powers in excess of 100 milliwatts at frequencies of 9.4 gigaHertz (GHz) with low-noise levels and a stabilization factor of approximately 200. A third cavity is coupled to the high-Q-cavity. The third cavity includes a voltage "-tunable" diode, a varactor which varies in capacitance as a function of applied voltage. This provides a tuner which permits changing the frequency of resonance of the high Q cavity without substantially affecting its Q-value.

INVENTORS:
Walter R. Day
Thomas H. Luchsinger
By Ronald M. Goldman
ATTORNEY

INVENTORS:
Walter R. Day
Thomas H. Luchsinger
By Ronald M. Goldman

TUNABLE HIGH-POWER LOW-NOISE STABILIZED DIODE OSCILLATOR

This invention relates to solid-state oscillators and, more particularly, to tunable low-noise high-power frequency-stabilized semiconductor diode oscillators for operation in the 10 GHz. range.

Heretofore, semiconductor diode oscillators of various types have been made available to fulfill many different applications. As is apparent, the designs for and performance required of oscillators, including semiconductor diode oscillators, differ from one another and depend upon their intended application.

Two particular systems that have incorporated semiconductor oscillators successfully are communications and radar systems. These systems require power at frequencies in the 10 GHz. frequency range. In a radar system the solid-state oscillator finds application as a "local oscillator" or "master oscillation," a source of single frequency energy. In a communication system the solid-state oscillator finds application as a local oscillator or as a frequency-modulated local oscillator, a source which can be tuned or modulated about a basic operating or carrier frequency. Performance requirements for solid-state oscillators in these communications systems necessitate that the solid-state oscillators be stable in frequency, preferably a gross frequency stability of 0.01 percent (%), have minimal or no spurious AM or FM noise signals, and have a high power output, preferably above 100 milliwatts.

As a general rule an oscillator of one type or another which meets the performance requirements demanded in the system is available. However, an oscillator which performs to the systems requirements can be extremely expensive or pose other serious handicaps which would preclude their use in a practical and economical system, or, in some applications, are so expensive as to render an entire system uneconomical. In addition to initial cost of constructing a satisfactory oscillator another important factor is the simplicity of operation and maintenance of the oscillator. Thus an oscillator is unacceptable if over periods of use it requires excessive maintenance or is too complicated to repair.

Various types of prior art oscillators which may incorporate solid-state semiconductors have been acceptable for use in communications systems. These include the conventional crystal controlled oscillators, phase locked loop oscillators and cavity (feedback) oscillators. One additional type of semiconductor oscillator of more simple construction than the aforementioned types is the semiconductor diode oscillator, Gunn or Avalanche.

The semiconductor diode oscillator incorporates as the active element a diode, suitably a Gunn diode or Avalanche (Impatt) diode. The physical electronic theory of the operation of these diodes to convert a DC bias voltage into electromagnetic energy is not here explained in detail but is available in much widely published literature to which reference may be made. Briefly, in these oscillators the semiconductor diode is located in a low-Q-resonant cavity which is tuned to the frequency at which a signal is desired, and a terminal is provided to which the DC bias source may be applied to the diode. The diode acts as a negative resistance which is greater than the loss resistance of the low-Q-cavity and load and the circuit breaks into oscillation to generate electromagnetic energy. While this oscillator provides a good example of the simplicity of construction and of reasonable output powers of 100 milliwatts, the elements by themselves are not without significant disadvantages which limit their use unless other elements, hereinafter discussed, are added to the circuit:

The broad band of the oscillator, or oscillator cavity, as variously termed, is essentially unstable and permits the output signal frequency to drift. In addition, the mechanics of signal generation by the diode and circuit are such as to create spurious signals or noise, as variously termed, which cannot be eliminated in the oscillator cavity. Moreover, this basic diode oscillator exhibits variations of frequency caused by variations of the load, commonly termed "pulling," that is undesirably large and variations of frequency caused by variations of the bias voltage, commonly termed "pushing," that is also undesirably large.

Practical semiconductor diode oscillators presently found in communications systems incorporate at least one additional element to overcome these difficulties. The basic structure of the diode and cavity, which we refer to as an oscillator section, is coupled to a stabilization cavity which is in turn connected to the load. The stabilization cavity is a second resonant cavity which has a quality or "Q" factor that is very large in comparison to the Q-factor of the cavity in which the diode is located. Typical of these Q-factors for the stabilization cavity is between 10,000 and 50,000 and typical of the Q-factors for the cavity in which the diode is located or, as variously termed, oscillator cavity is between 200 and 1000 . The stabilization cavity includes an input coupling and an output coupling. The input coupling is coupled to the output of the oscillator stage and the output of the stabilization cavity is coupled to the load. In effect, the stabilization cavity prevents oscillator drift, eliminates much of the noise or spurious AM and FM signals, and greatly enchances the pushing and pulling factors.

Unfortunately, that present design is not without a single significant disadvantage. In passing microwave frequency energy from the oscillator cavity through the stabilization cavity to the output an approximate 10–13 db. drop in output power typically results. In other words there is a 90 to 95 percent loss of power from that available initially at the output of the oscillator section. Thus an oscillator capable of generating 100 milliwatts of microwave power, albeit noisy and unstabilized, with the added stabilization cavity delivers instead at the output circuit a pure stabilized signal of only 5 to 10 milliwatts.

To compensate for these reduced power levels and to raise the power levels to the more desirable 100 milliwatts power the prior art oscillators include a further addition which, effectively, may be considered as a stage of amplification. In this an injection locked oscillator stage is coupled in circuit between the stabilization cavity and the load. Such an injection locked oscillator is essentially of the same construction as the oscillator in the oscillator section and consists of a diode, suitably Gunn or Avalanche diode, located within a low-Q-resonant cavity, with a means for applying to the diode a DC bias potential.

Since this second stage oscillator, by itself, is capable of generating 100 milliwatts of output power the desired output power levels are obtained by "injection locking" the second or injection locked oscillator stage with the stabilized low-noise signal obtained at the output of the stabilization cavity. This obtains the desired purity of the output signal with power outputs of the desired level. Thus, while adding certain elements increase the complexity as compared to the basic oscillator stage, a solid-state diode oscillator suitable for use in communication and radar system has heretofore been available. While the foregoing diode oscillator is available in the prior art it is worthwhile to consider that device in perspective among other types of oscillators including solid state diode oscillators.

Reference is made to pages 90, 92, and 94 of the Feb. 1970 issue of the magazine MICROWAVES. On the cited pages the magazine reports the results of a survey of all oscillators that are considered "high stability," those having a stability better than 0.01 percent in the frequency range of 0.24 GHz. through 29 GHz.

These oscillators are listed by type and the list includes crystal, phase lock, and cavity (ceramic triode or transistor in feedback type cavity). Of the approximately 135 model types, only two are designated "cavity-Gunn" and "injection lock-Gunn." These models are the Avantek AV 9701 which delivers 10 milliwatts and the Avantek AV 9702 which delivers 100 milliwatts and comprises essentially the model AV 9701 with an additional injection locked oscillator stage. The configuration of these types of oscillators has been discussed previously and is more graphically illustrated on page 13 of the May 1969 issue of the same magazine, MICROWAVES.

By contrast to the dearth of Avalanche and Gunn-diode-type oscillators under the heading of "high stability," pages 72 and 74 of the MICROWAVES article surveys approximately 120 model types of Avalanche diode oscillators and pages 76 and 83 surveys approximately 100 model types of Gunn diode oscillators.

On the basis of the aforementioned survey one can thus conclude that, except for the two models mentioned, Gunn or Avalanche diode-type oscillators which possess the "high stability" desired in the communication and radar systems and with the added capability of electronically tuning same while retaining "high stability" are absent.

By way of further example of prior art diode oscillators it is noted that the United States Government funded a search for a solid-state oscillator which could perform to the desired low-noise, high-stability and high-power levels. An oscillator which is a variation of the injection-locked oscillator construction, heretofore discussed, resulted from this study as is reported in Technical Report, March 1970, under Contract F 33,615 -69-C-1,519, Project 698 CK, for Wright-Patterson Air Force Base by Sperry Microwave Electronics Division. While the injection locked oscillator performs acceptably, it is a more complex and expensive unit than is desirable.

Therefore, it is an object of this invention to provide a tunable low-noise high-power stabilized diode oscillator which is of a more simple and inexpensive construction than has heretofore been available.

It is a still further object of this invention to provide a tunable stabilized diode oscillator for producing high-power low-noise microwave energy without using an amplifier or an injection locked oscillator as elements thereof.

And it is an additional object of the invention to produce a tunable solid-state diode oscillator capable of delivering 100 milliwatts in the frequency range of 5–15 GHz. having the simplicity of the elements of the low power stabilized diode oscillator but which has the performance of the high-power injection-locked oscillator units.

Briefly stated, the invention comprises a solid-state diode such as the Gunn or Avalanche diode properly biased for operation and located in a low-Q-resonant cavity with an output circuit coupled directly to the low-Q-cavity. In addition, a high-Q-resonant cavity tuned to the same frequency as the low-Q-cavity is coupled electromagnetically tightly to the low-Q-cavity.

In accordance with other aspects of our invention the coupling between a load and the low-Q-cavity is made by means of a transmission line which couples same together electromagnetically "tightly."

In accordance with a further aspect of our invention the high-Q-cavity is coupled to a third cavity which includes a varactor diode which provides a tuner mechanism for modulating the frequency of the high-Q-cavity and hence the oscillator without affecting substantially the Q of the high-Q-cavity.

In accordance with our invention the seemingly simple departure from diode oscillators of the prior art provides unusual results. The oscillator of the invention provides the same performance as those prior art microwave diode oscillators which include effectively an amplification stage, suitably an injection locked oscillator, without the complexity of such amplification. Thus, power output in excess of 100 milliwatts is obtained with low spurious noise and with a stability factor of at least 200. By comparison with the basic microwave diode oscillator construction the comparison is even more dramatic. The prior art single stage stabilized microwave diode oscillators provide low power outputs on the order of 20 milliwatts. The oscillator of the present invention achieves high-power outputs of 100 milliwatts, an increase in power output by a factor of 5 and is tunable over a 1.5 MHz. range. Compared to prior art microwave diode oscillators which do not in incorporate stabilization the sideband noise with the present invention is reduced by a factor of approximately 200 the pushing factor is reduced from 860 KHz./volt to 4 KHz./volt and the pulling factor at VSWR of 1.5 is reduced from 16.2 MHz. to 0.08 MHz.

The foregoing and other objects and advantages of the invention together with its arrangement and from and possible modifications thereof is better understood from a consideration of the following detailed description taken together with the figures of the drawing, in which.

Figure 1:
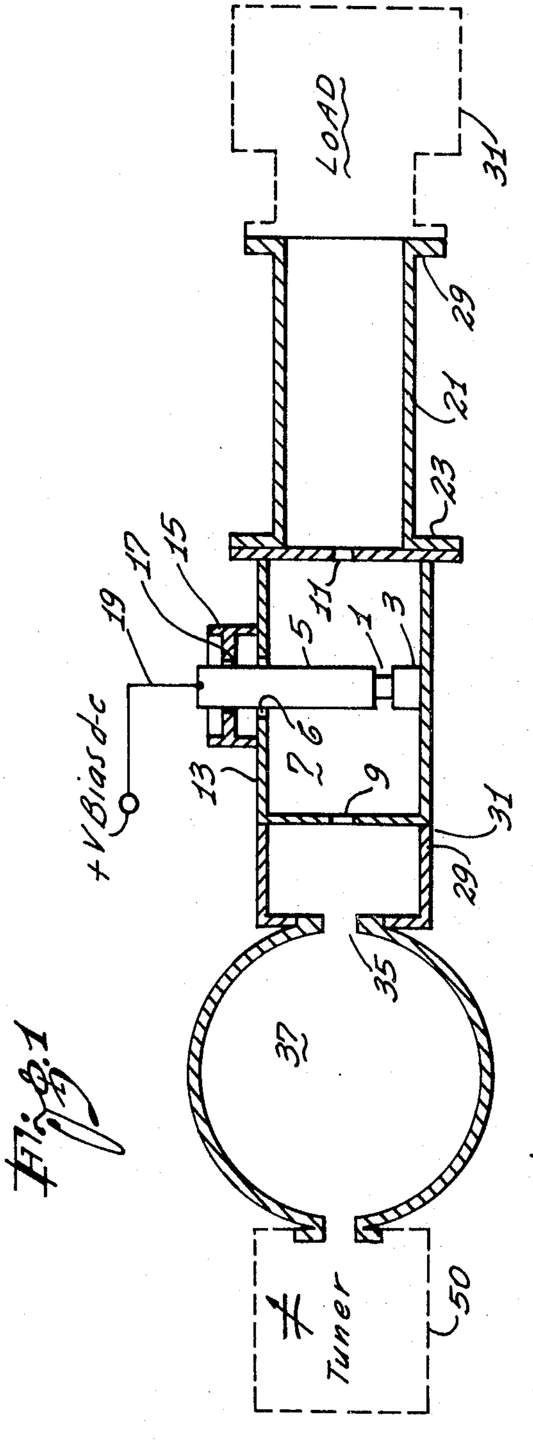
FIG. 1 illustrates a schematic mechanical cross section drawing of the oscillator of the invention.

The mechanical schematic cross section of the invention in FIG. 1 shows a semiconductor diode 1, suitably a Gunn diode, or an Avalanche (Impatt) diode such as Model VAO–12 C. The negative diode terminal is seated on a metal electrode 3 and the positive diode terminal is connected to a cylindrical metal electrode 5. The electrodes 3 and 5 provide a current path through diode 1. The diode is located in a resonant cavity 7. Cavity 7 is of a rectangular metal body, suitably copper, bounded by conductive walls and is dimensioned internally to be resonant at the desired frequency, $f_0$ , of operation of the oscillator, 9.4 GHz. The cavity has a low-quality factor, "Q," on the order of "200." Microwave cavity 7 which we refer to as the oscillator cavity is of conventional construction and design and is described in the literature. It is noted that the illustration of FIG. 1 for purposes of clearly illustrating the construction of the invention does not include minor structural details such as nuts and bolts, welds, brackets, etc. and is of exaggerated proportions. By design the distance between walls of cavity 7 is a multiple of one-half wavelengths at the frequency to which the cavity is designed to be resonant. And, for example, the distance between the right and left-hand walls of cavity 7 is approximately 1.230 for resonance at 9.4 GHz. A microwave passage, output iris 11, is located on the right-hand side of cavity 7.

Electrode 5 extends through an opening 6 in an upper metal wall 13 of cavity 7 and is spaced or insulated from the wall to prevent an electrical short circuit. A concentric metal ringlike member 15 is mounted along open edge to cavity wall 13 concentric with electrode 5. The ringlike member 15 supports a washerlike metal spacer 17. Spacer 17 has a central opening slightly larger in diameter than electrode 5. Metal electrode 5 extends through and clears the sides of the central opening so that spacer 17 is electrically insulated therefrom. To avoid RF leakage the outer radius of washer member 17 is made approximately one-quarter wavelength and the distance between the underside of washer 17 and the outer surface of wall 13 is preferably one-quarter wavelength. With these dimensions the metal members function with the low impedance line formed by electrode 5 as radio (microwave) frequency chokes. Thus the quarter wavelength line between the underside of washerlike members 17 and the opening through which electrode 5 protrudes into cavity 7 reflects electrically a short-circuit, whereas the line between electrode 5 and member 15 in turn reflects an open circuit. These structures thus serve to prevent leakage of RF through the opening in wall 13.

Line 19 connects electrode 5 to one terminal of a source of DC bias voltage, not illustrated, while the other terminal of the bias source is connected to electrical ground potential. Electrode 3 is electrically connected through a metal wall of cavity 7, electrical lead 20, to ground potential. The foregoing elements may be referred to as the "oscillator section" of the oscillator of the invention.

A microwave transmission line, waveguide 21, has an end flange 23 coupled to the output flange on oscillator cavity 7 to receive the microwave energy output transmitted through iris 11. At its other end waveguide 21 includes end flange 29, of conventional construction. Symbolically illustrated by the dashed lines 31, a radio or microwave frequency load of any conventional kind or type is coupled in a conventional manner to receive microwave energy from transmission line 21. The length of the transmission line is made such as to provide the desired degree of VSWR and coupling. The load, for example, may be other electronic stages in a communications or radar receiver.

It is noted that the waveguide section is included in FIG. 1 merely for purposes of illustration as a conventional means of routing or guiding microwave energy from one location to another. Thus transmission line 21 may be omitted and the load 31 may be coupled directly to the oscillator section output if the form, fit, size and location of load 31 permits. Moreover, although output iris 11 in the oscillator section and transmission line 21 illustrated in this embodiment is of the waveguide variety, it is apparent to the reader that the output coupling and transmission line can, instead, be of the coaxial output and coaxial line variety of transmission line or any other well known equivalent.

Another microwave transmission line, waveguide 29, is schematically illustrated to couple the oscillator section.

Again it is apparent to the reader that waveguide section 29 is included merely for purposes of illustration and depending on the form, fit and relative size of the two microwave cavities, a packaging problem, it is possible to eliminate waveguide section 29 and couple together directly cavity 37 and low-Q-cavity 7. In that instance iris 35 of the former is directly connected with iris 9 of the latter. As is also apparent to the reader the section of transmission line illustrated in the preferred embodiment is of the waveguide variety and may instead be replaced in a known manner by the conventional coaxial variety of transmission line.

The microwave cavity 37 is of a cylindrical geometry with the cylindrical axis perpendicular to the plane of the drawing and with a microwave passage, iris 35, in a cylindrical wall.

By design of its dimensions microwave cavity 37 is a high-Q-cavity, suitably 47,000, resonant at the same frequency essentially as cavity 7. While not apparent in the illustration the physical size cavity 37 is larger than cavity 7 in the oscillator section. For example, the cylindrical $TE_{014}$ mode cavity has inner dimensions of 2.490 inch D. ×3.250 inch long in comparison to corresponding dimensions 0.400 inch ×900 inch ×1.230 inch of the low-Q-cavity 7. Cavity 37 is constructed of a metal, preferably Invar. Invar has a low-temperature coefficient of expansion and therefore does not change in dimension, substantially, as a result of ambient temperature changes.

Ideally, the length of the waveguide transmission line 29 is made to be of such a length that the effective electrical distance between iris 35 and the axis of diode 1 together forms an effective length of transmission line that is a multiple of one-half wavelength (one-half λ ) at the center frequency of operation of the oscillator. The coupling iris size is chosen to provide a good match (VSWR of 1.00 ) thus providing "tight" electromagnetic coupling between the two cavities. I an embodiment that eliminates waveguide 29, the distance between iris 35 and the axis of diode 1 is, likewise, a multiple of one-half λ.

Figure 4:
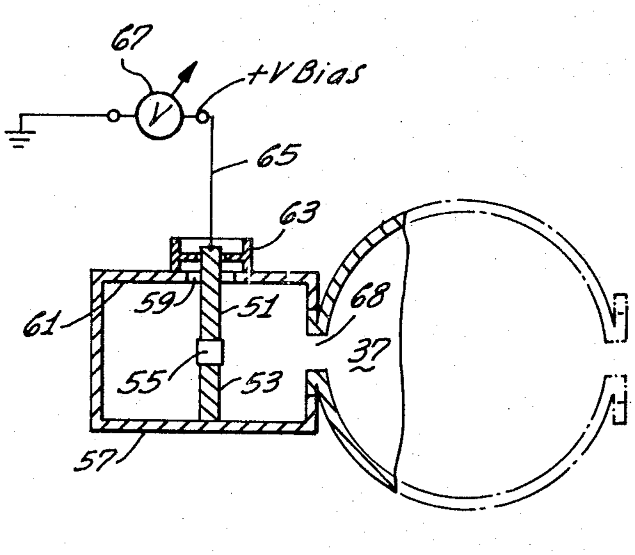
FIG. 4 illustrates in detail the tuner incorporated in the invention of FIG. 1.

The tuner 50 indicated in dashed lines is coupled to high-Q-cavity 37 for tuning or changing the frequency of resonance of cavity 37 through changes in effective capacitance without lowering the Q of cavity 37. The construction of tuner 50 is discussed in greater detail in connection with and is illustrated in FIG. 4.

In operation the source of direct current bias is applied between lead 19 and ground. With the Gunn diode type of semiconductor diode the bias source conventionally is of a range of 8 to 12 volts and is capable of supplying between 350 and 500 milliamps. Alternatively, the bias source conventionally used with the Avalanche type or Impatt type, as variously termed, semiconductor diode is between 60 and 90 volts with the capability of delivering between 30 and 50 milliamps. Upon application of the bias potentials a current flows through line 19 electrode 5 through semiconductor diode 1 through the electrode 3 to ground. In a conventional and well-known manner diode 1 acts as a negative resistance and in combination with cavity 7 and the effective impedance of load 1 reflected to the cavity generates a microwave frequency signal or electromagnetic energy, as variously termed. This energy is transmitted to within the boundaries of low-Q-oscillator cavity 7. The characteristics of resonant cavity 7 are such that it emphasizes or enchances, as variously termed, the generation of microwave energy of the frequency to which the cavity is tuned. Alternatively, the cavity can be viewed as converting the electromagnetic energy fed into it by the diode into a periodic frequency dependent upon the equivalent inductance and capacitance of the cavity. In the preferred embodiment cavity 7 is resonant at a frequency of 9.4 GHz. and supports that frequency of resonance in the $TE_{102}$ mode. Some of this microwave energy is passed through iris 9 and transmission line 29 through iris 35 into high-Q-cavity 37, which we refer to as a "reaction stabilizing" cavity. Because the high-Q-cavity is located at the detuned short position of the oscillator cavity, i.e. approximately a multiple, odd or even, of one-half wavelength from the axis of diode 1, and is tightly coupled to the oscillator cavity 7, its reactance appears across the diode and stabilizes the oscillation frequency. The output microwave energy passes through output iris 11 through waveguide 21 to load 31.

For explanation a "stabilization factor," S, is defined. $S=(E_o+E_S)E_o$, where $E_o$ equals the energy stored in the oscillator cavity and $E_s$ equals energy stored in the stabilizing cavity. Since the $Q_o$ (Q of unloaded cavity) of the stabilizing cavity is much greater than the $Q_o$ of the oscillator cavity, suitably a ratio of 47,000 to 200 in the preferred embodiment, there results a very large improvement in oscillator section frequency stability. It can be shown that the stabilization factor S for two closely coupled resonators is $S=$ approximately $[(Q_{os}/Q_{eo})+1]$ where $Q_{os}$ equals $Q_o$ of the stabilizing cavity and $Q_{eo}$ equals $Q_{external}$ of the oscillator cavity. Thus $(47,000/200)+1=231$ or a factor, $S$, greater than 200 is obtained. Additionally, it can be shown that the voltage or current pushing figure of unstabilized oscillator is reduced by the stabilization factor, $S$. Thus in the preferred embodiment we have a reduction of the pushing figure of approximately 200, down to 4 KHz./volt. In addition the load pulling figure is reduced by approximately the same factor, down to 0.008 MHz. at a VSWR of 1.5. And AM and FM noise is also reduced by the action of the reaction stabilizing cavity while an output of 100 milliwatts at 9.4 GHz. is attained.

Figure 2:
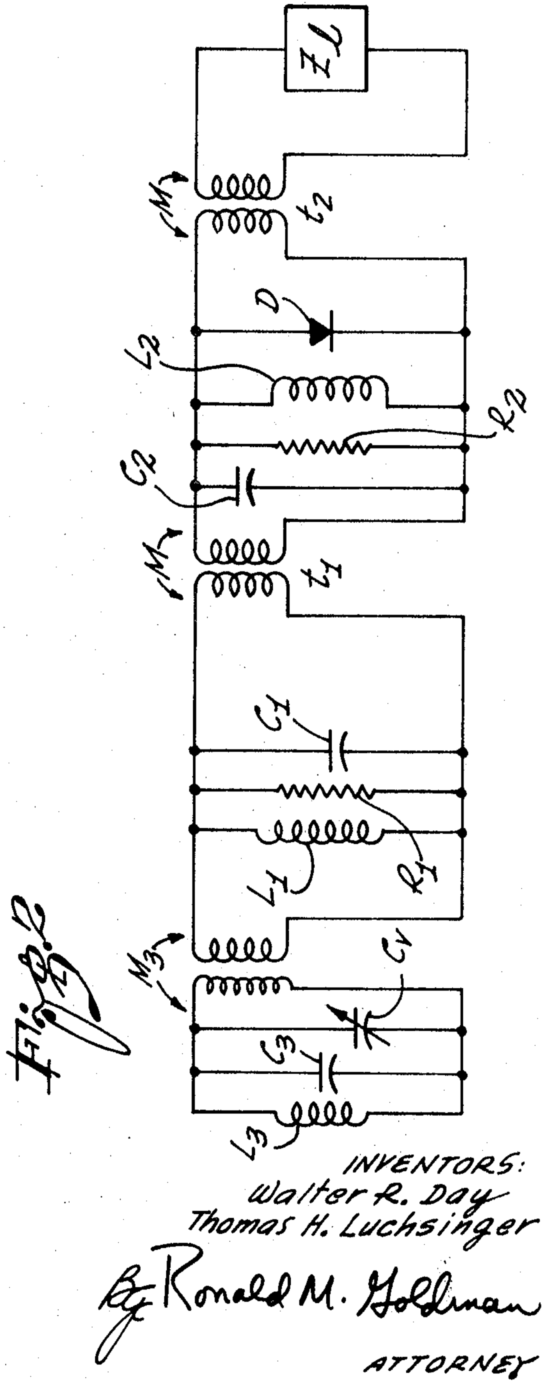
FIG. 2 illustrates schematically a lumped constant equivalent circuit diagram of the oscillator of the invention.

FIG. 2 illustrates a lumped constant equivalent circuit for the embodiment of FIG. 1. $R_1$, $L_1$, and $C_1$ in parallel electric circuit represent the equivalent lumped constant parameters for high-Q-cavity 37. $R_2$, $C_2$ and $L_2$ represent the lumped equivalent elements of the oscillator resonant cavity 7 including diode. 1. M represents the coupling between the two resonant circuits. D represents the diode which acts as a negative resistance in the $R_2$, $L_2$, $C_2$ circuit and $M_2$ represents the coupling to a load $Z_1$. $L_3$ and $C_3$ represents the inductance and capacitance of the tuner cavity, $C_r$ represents the capacitance of a varactor diode within the cavity and $M_3$ represents the coupling between the tuner and high Q cavity.

Figure 3A:
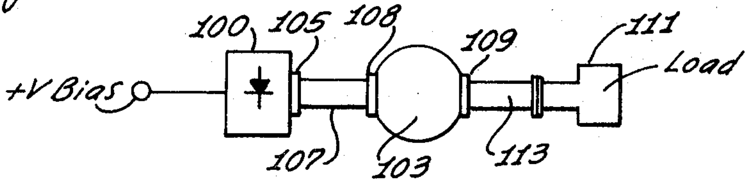
Fig. 3A (Prior Art)
FIGS. 3A, 3B and 3C illustrate, symbolically, a single-stage stabilized microwave diode oscillator of the prior art, a double-stage stabilized oscillator of the prior art, and the oscillator of the invention, respectively.
Figure 3B:
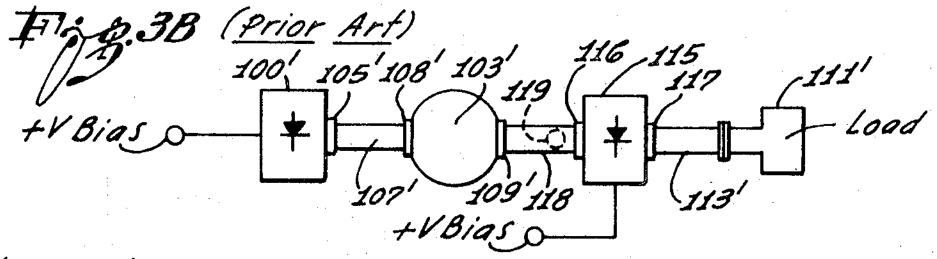
Fig. 3B (Prior Art)
Figure 3C:
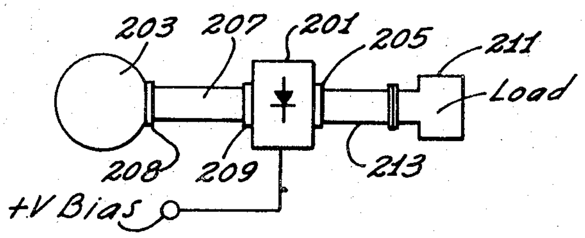

Reference is now made to FIGS. 3A, 3B and 3C which compares the schematic symbolic structure of the oscillator without the tuner as illustrated in FIG. 3C with the two types of prior art solid-state oscillators illustrated in FIGS. 3A and 3B.

FIG. 3A schematically shows the basic low-power stabilized oscillator presently found in commercial use. This includes an oscillator section 100 which comprises a semiconductor diode of the Gunn or Avalanche variety located within a low-Q-resonant cavity. The diode is biased from a DC source in the same manner, essentially, as described in the construction of the corresponding stage of the invention of FIG. 1. A high-Q-resonant cavity 103 is coupled at its input 108 to the output 105 of the oscillator section by transmission line 107. The output 109 of the high-Q-cavity is coupled to load 111 by waveguide transmission line 113.

In this basic prior art stabilized oscillator microwave frequencies are generated and coupled via waveguide 107 to high-Q-cavity 103, which is tuned essentially or resonant to the same frequency as that to which oscillator section low-Q-resonant cavity is tuned. Cavity 103, however, is resonant at a $TE_{01M}$ cylindrical electrical mode and therefore has lower wall losses and accordingly a higher Q. As a result, cavity 103 stabilized the frequency of oscillator stage 100 characterized by the relationship between the energy stored in the high-Q-cavity 103 and the energy stored in the low-Q-cavity of the oscillator stage as previously explained in connection with the operation of the invention illustrated in FIG. 1. The microwave energy is then coupled via transmission line 113 to load 111.

Typically, an unstabilized oscillator of the Gunn or Avalanche diode type, one which consists essentially of the oscillator section 100 alone and which does not include the high-Q-stabilizing cavity 103 is capable of delivering output power in the frequency range of 10 GHz. in excess of 100 milliwatts. The oscillator section is thus "high power." Unfortunately, the output is noisy and unstable. Thus the output frequency drifts and includes spurious AM and FM noise frequencies which render the use of such an oscillator impractical in many communication and radar systems. Pushing and pulling factors are poor. Thus, the inclusion of stabilization cavity 103 minimizes to a desired low-level frequency drift and noise and provides a usable relatively clean or pure signal at its output 109. Hence the adoption of the term "stabilization cavity" for cavity 103.

Unfortunately, the advantages accruing in the -milliwatts art oscillator represented in FIG. 3A by the incorporation of stabilization cavity 103 is not without a single important disadvantage. There is a typical 12 db. drop in available power at oscillator output 109. This reduces the output power available from the oscillator as a whole by a factor of 93 percent. Accordingly, while the oscillator stage 100 is capable of delivering in excess of 100-milliwatts output power, the output power derived at the output of the stabilization cavity 103 is barely 12 milliwatts.

In FIG. 3B those oscillator elements which correspond in construction to elements found in FIG. 3A are similarly numbered and hyphenated. The diode oscillator section 100' is coupled at its output 105' by transmission line 107' to the input 108' of high-Q-stabilization cavity 103'. The output 109' of stabilization cavity 103' is coupled to a transmission line 118. An injection-locked oscillator 115 is connected at an input 116 to transmission line 118 and at an output 117 to transmission line 113' which in turn is connected to load 111'. A source of DC bias is connected to each of the injection located oscillator 115 and basic oscillator stage 100'. And, suitably, and isolator device, which may be a Ferrite 119, is located in transmission line 118.

As discussed in connection with FIG. 3A the microwave energy is generated at a frequency, $f_o$, within the low-Q-oscillator cavity 100' in the oscillator FIG. 3B, and stabilizer cavity 103' stabilizes the signal in a manner heretofore adequately discussed. To overcome the effects of reduced power outputs at the 12-milliwatt level and to raise the output of the oscillator to the high-power 100-milliwatt level a device akin to an amplifier is incorporated in the circuit: injection-locked oscillator 115. In substance injection-locked oscillator 115 is simply an oscillator of substantially the same construction as the basic oscillator section stage 100'. Thus the oscillator stage 115 includes a semiconductor diode, suitably a Gunn or Avalanche diode, which generates microwave energy in the low-Q-cavity and which is capable of developing output powers in excess of 100 milliwatts. The oscillator is injection locked at the single stabilized $f_o$ from oscillator section 100' which is supplied over transmission line 118 and introduced to the low-Q-cavity of the second oscillator 115.

It is wall known that multiple oscillators which are tuned to the same general frequency may be coupled together and that energy fed from the first oscillator to the second can be used to cause the second oscillator to "lock" in, or, as otherwise stated, oscillate at a frequency identical to that of the first oscillator even though the natural frequency of oscillation of the second oscillator may be different slightly than the natural frequency of oscillation of the first oscillator. Thus the stabilized noise free signal, $f_o$, presented at the input 116 of the second oscillator 115 forces the second oscillator 115 to oscillate at the single noise-free frequency of the input signal. Thus second oscillator 115, inherently capable of delivering output power in excess of 100 milliwatts, provides at its output of the oscillator the desired pure signal of the high-power levels as is desired in the communication system, such as represented by load 111'.

A "way" device, as the isolator represented by the dashed lines 119, is suitably located in waveguide 118 and adjusted in a conventional manner so that the energy passes through the waveguide in only one direction: from cavity 103' to oscillator stage 115 and not vice versa. Absent the isolator 119 it is possible for the second oscillator 115 to provide energy which goes back through stabilizing cavity 103' to oscillator 100' to'-'lock" in oscillator 100' at an undesired frequency. Hence the oscillator output at 117 would be replete with noise and would be unstabilized. Oscillators of this type have been discussed adequately in the paragraphs preceding the objects of the invention.

By comparison, FIG. 3C symbolically represents the main structure of the invention less tuner previously described in greater detail in connection with FIGS. 1 and 2. Thus there is illustrated an oscillator stage 201 which is connected by means of a transmission line 207 attached at input 209 of the oscillator to the input 208 of a high-Q-resonant cavity 203. The output 205 of oscillator 201 is connected by means of transmission line 213 to load 211. In addition, the oscillator is connected to a suitable source of DC bias. A comparison of the symbolic representation of the elements in the invention as illustrated in FIG. 3C with that of the prior art in FIG. 3A appears to show no more than a rearrangement of elements. However the output of the oscillator described in accordance with out invention provides a frequency stable relatively noise free signal in excess of 100 milliwatts, whereas the output of the prior art devices such as shown in FIG. 3A is a low-power 12 milliwatts. A comparison of the oscillator of the invention symbolically illustrated in FIG. 3C with that of FIG. 3B appears to indicate that the differences between our invention are not more than a deletion of elements However, it is noted that the prior art added the additional elements to the basic oscillator of FIG. 3A, that is added the injection locked oscillator stage 115' and an isolation device 119', in order to obtain the same results of high-power low-noise stabilized oscillator as is accomplished with the few elements of the oscillator of our invention. Thus, the arrangement of elements in accordance with our invention provides an oscillator having the simplicity of those prior art devices which are essentially low power. At the same time our oscillator provides the advantages and performance results that are available presently in the prior art solely in devices of greater complexity which incorporate additional elements such as a full stage of injection-locked oscillator. Accordingly, it is seen that the arrangement of an oscillator configuration in accordance with teachings of our invention achieves unexpected results by arranging the elements in a manner not taught or illustrated in the prior art.

The oscillator of the invention is voltage tunable so as to function as a modulated local oscillator with the construction that is in greater detail disclosed in FIG. 4. FIG. 4 illustrates in cross section a mechanical schematic of the tuner so indicated by dashed lines in FIG. 1 together with a portion of the high-Q-stabilizing cavity 37 of FIG. 1. The tuner includes two electrodes 51 and 53 in contact with the positive and negative terminals, respectively, of a varactor diode 55, suitably a Model VAT-51N DIODE) Diode 55 is located in a metal cavity 57, generally rectangular in shape. The electrode 51 extends through an opening 59 in top wall 61 of cavity 57 so as to be insulated therefrom. A suitable RF choke joint 63 substantially identical in structure to the joint used for electrode 5 in the oscillator of FIG. 1 is employed. Electrode 51 is connected by lead 65 to one terminal of a source 67 of negative bias. Bias source 67 is variable as indicated by the arrow symbol to different voltages manually or automatically in a conventional manner. One terminal of the bias source and the wall of the cavity 57 are electrically grounded as illustrated in FIG. 4. The high-Q-stabilizing cavity 37 of figure include an additional microwave passage or iris 68 which permits the passage of microwave energy therethrough into the open wall of cavity 57. As is conventional, varactor 55 is a diode device which changes its effective capacitance as a function of the DC voltages applied thereto from bias source 67. The varactor is located substantially midway between the right and left-hand walls of the cavity 57, which are suitably spaced apart approximately one-half λ. The varactor thus appears at a location one-quarter wavelength from iris 68 and would be at a high nodal point of the electric field which appears in cavity 57 as a consequence of the microwave energy passing into cavity 57 from cavity 37. Thus the electric field intensity is greatest at the location of the varactor. The electric field is further intensified at diode 55 because the electrodes 51 and 53 concentrate the electric field across their tips. Thus a change in the electrical capacitance of varactor 55 is reflected as a change of capacitance of cavity 57, which, in turn, is reflected as an equivalent impedance at iris 68 of high-Q-stabilizing cavity 37. Since the resonant frequency of high-Q-stabilizing cavity 37 is dependent upon its effective electrical characteristics the changes in capacitance reflected into iris 67 changes, accordingly, the effective electrical parameters of cavity 37 and thus causes cavity 37 to be resonant at a correspondingly different frequency. Thus the tuner provides frequency modulation and is found not to lower, substantially, the high-Q of cavity 37. In practice the tuner provided shifts in output frequency of the oscillator that departed from the 9.4 GHz. carrier frequency by 3.4 MHz. as a function of bias voltage changes of between 0 to –6 volts. Moreover the tuning was linear over a 1.5 MHz. range and had a characteristic modulation sensitivity of 1 MHz. per volt.

The foregoing embodiment has been presented solely for purposes of illustrating our invention and are not intended to limit our invention in any way since numerous equivalents and variations thereof which do not depart from the spirit of the illustrated embodiments suggest themselves to those skilled in the art. Accordingly it is understood that the invention is to be broadly construed within the spirit and scope of the appended claims.

What is claimed is:

1. A tunable high-power low-noise stabilized diode oscillator for producing microwave frequency output power in excess of 100 milliwatts comprising:

a. an oscillator section for providing electromagnetic energy of a frequency, *f*, at an output, said oscillator section including a1. semiconductor diode means having a negative resistance characteristic, a2. a low-Q microwave cavity having a resonant frequency, *f*, a3. said diode means being located within said low-Q microwave cavity, a4. means for applying bias voltages to said diode means, a5. first microwave passage means in said low-Q-cavity for providing an output for coupling to a load means, and a6. second microwave passage means in said low-Q-cavity, said diode means in combination with said low-Q-cavity for generating microwave frequency energy;

b. a high-Q-microwave cavity resonant at a frequency substantially the same as that of the resonant frequency of said low-Q-cavity; said high-Q-microwave cavity containing a first microwave passage therein for permitting passage of microwave energy therethrough;

c. coupling means coupling together said second microwave passage means and said microwave passage means of said high-Q-cavity to couple together electromagnetically tightly said high-Q-cavity and said low-Q-cavity; and d. a third low-Q-microwave cavity, a varactor diode for varying the effective electrical capacitance of said cavity as a function of applied tuning voltage, said varactor diode being located in said third low-Q-cavity for changing the means capacitance thereof coupling said third low-Q-cavity to said high-Q-cavity for coupling electric fields therebetween and changing the frequency of resonance of said high-Q-cavity in dependence thereon, and means for applying tuning voltages to said varactor diode.

2. The invention as defined in claim 1 further comprising (d) load means coupled to said first passage means.

3. The invention as defined in claim 1 wherein said high-Q-cavity has a Q of approximately 47,000 and said low-Q-cavity has a Q of approximately 200.

4. The invention as defined in claim 1 wherein said coupling means comprises a microwave transmission line, and wherein the effective electrical distance between the axis of said diode means and the end of said second microwave passage means equals approximately Nλ/2, where N is an integer, 1, 2,'N.

5. The invention as defined in claim 1 wherein said high-Q-cavity has a Q-factor greater than 10,000 and said low-Q-cavity has a Q-factor between 200 and 1,000.

6. The invention as defined in claim 1 wherein the ratio of the Q-factor of said high-Q-cavity to the Q-factor of said low Q-cavity is greater than 10.

7. The invention as defined in claim 1 wherein said diode means comprises an Avalanche diode.

8. The invention as defined in claim 1 wherein said diode means comprises a Gunn diode.

9. A tunable high-power low-noise stabilized microwave diode oscillator for providing output powers in the 100-milliwatt level and above, with a low-noise factor and a stabilization factor *S* of around 200 comprising a first microwave cavity having a frequency of resonance, *f*, said cavity having a low-Q-factor; a microwave diode located in said first cavity, said microwave diode in combination with said first cavity for generating electromagnetic energy in the microwave frequency range within said first cavity; microwave load means; means coupling said load means to an output of said first microwave cavity; a second microwave cavity, said second microwave cavity being resonant at the same frequency of resonance as said first microwave cavity and having a relatively high-Q-factor; means coupling together electromagnetically tightly said first microwave cavity and said second microwave cavity; means for applying bias voltages to said microwave diode means; a third microwave cavity, said third cavity having a relatively low-Q-factor; a varactor diode situated within said third cavity for changing the effective electrical capacitance of said third cavity as a function of applied tuning voltage, means coupling electromagnetic fields between said third cavity and said second cavity for changing the frequency of resonance of said second cavity as a function of the change in capacitance of said third cavity; and means for applying tuning voltages to said varactor diode.

* * * * *

PO-1050
(5/69)

UNITED STATES PATENT OFFICE
CERTIFICATE OF CORRECTION

Patent No. 3,626,327 Dated December 7, 1971

Inventor(s) Thomas Hugo Luchsinger and Walter Ransom Day, Jr.

It is certified that error appears in the above-identified patent and that said Letters Patent are hereby corrected as shown below:

In Column 1, line 67, between the words "band" and "of", insert -- low Q cavity --.

In Column 4, line 43, between the words "passage," and "output", insert -- or iris 9 is located on the left side of cavity 7. A second microwave passage, --.

In Column 4, line 48, the word "open" should read -- one --.

In Column 5, line 59, the word "I" should read -- In --.

In Column 6, line 31, between ")" and "$E_o$" insert -- ÷ --.

In Column 6, line 38, between "$Q_{os}$" and "$Q_{eo}$" insert -- ÷ --.

In Column 6, line 47, "0.008" should read -- 0.08 --.

In Column 7, line 34, the word "milliwatts" should read -- prior --.

In Column 8, line 17, between the words "A" and "way" insert -- "one --.

In Column 8, line 17, between the words "device," and "as" insert -- such --.

In Column 8, line 43, the word "out" should be -- our --.

In Column 9, line 1, the model "VAT-51N DIODE)" should read -- VAT-51N20 diode. --.

Signed and sealed this 13th day of June 1972.

(SEAL)
Attest:

EDWARD M.FLETCHER, JR.
Attesting Officer

ROBERT GOTTSCHALK
Commissioner of Patents